(12) United States Patent
Feustel et al.

(10) Patent No.: US 7,764,078 B2
(45) Date of Patent: Jul. 27, 2010

(54) TEST STRUCTURE FOR MONITORING LEAKAGE CURRENTS IN A METALLIZATION LAYER

(75) Inventors: Frank Feustel, Dresden (DE); Thomas Werner, Moritzburg (DE); Carsten Peters, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 11/623,372

(22) Filed: Jan. 16, 2007

(65) Prior Publication Data

US 2007/0296439 A1    Dec. 27, 2007

(30) Foreign Application Priority Data

May 31, 2006    (DE)    .............. 10 2006 025 351

(51) Int. Cl.
  G01R 31/26    (2006.01)
  G01R 31/36    (2006.01)
  H01L 23/58    (2006.01)
(52) U.S. Cl. .................... 324/765; 324/763; 257/48
(58) Field of Classification Search ............... 324/763, 324/765, 766, 500, 537; 257/48
  See application file for complete search history.

(56) References Cited

U.S. PATENT DOCUMENTS

| | | | | | |
|---|---|---|---|---|---|
| 3,596,269 | A | * | 7/1971 | Laska | 340/518 |
| 5,485,095 | A | * | 1/1996 | Bertsch et al. | 324/537 |
| 5,517,107 | A | * | 5/1996 | Ovens et al. | 324/158.1 |
| 5,561,367 | A | * | 10/1996 | Goettling et al. | 324/158.1 |
| 5,777,486 | A | * | 7/1998 | Hsu | 324/763 |
| 5,821,765 | A | * | 10/1998 | Ling et al. | 324/765 |
| 5,838,161 | A | * | 11/1998 | Akram et al. | 324/755 |
| 6,111,269 | A | * | 8/2000 | Moyal | 257/48 |
| 6,312,964 | B1 | * | 11/2001 | Moyal | 438/18 |
| 6,348,701 | B1 | | 2/2002 | Joo et al. | 257/48 |
| 6,351,135 | B1 | * | 2/2002 | Kim | 324/769 |
| 6,449,749 | B1 | | 9/2002 | Stine | 716/4 |
| 6,531,777 | B1 | | 3/2003 | Woo et al. | 257/752 |
| 6,787,800 | B2 | | 9/2004 | Weiland et al. | 257/48 |
| 6,844,751 | B2 | * | 1/2005 | Marshall et al. | 324/765 |
| 7,001,693 | B2 | | 2/2006 | Liebmann et al. | 430/5 |
| 7,147,976 | B2 | | 12/2006 | Liebmann et al. | 430/5 |
| 7,176,675 | B1 | | 2/2007 | Liegel | 324/158.1 |
| 7,312,003 | B2 | | 12/2007 | Cote et al. | 430/5 |
| 7,356,800 | B2 | | 4/2008 | Stine et al. | 716/21 |
| 7,373,625 | B2 | | 5/2008 | Stine et al. | 716/4 |
| 7,392,502 | B2 | | 6/2008 | Percin et al. | 716/19 |
| 7,434,197 | B1 | | 10/2008 | Dolainsky et al. | 716/19 |
| 7,486,097 | B2 | | 2/2009 | Liegl | 324/765 |
| 2002/0089345 | A1 | | 7/2002 | Doong et al. | 324/765 |

(Continued)

FOREIGN PATENT DOCUMENTS

EP    1 128 424    8/2001    ............ 21/66

*Primary Examiner*—Ha Tran T Nguyen
*Assistant Examiner*—Karen M Kusumakar
(74) *Attorney, Agent, or Firm*—Williams, Morgan & Amerson, P.C.

(57) ABSTRACT

By providing a plurality of resistors and a plurality of test patterns within a leakage current test structure, the number of probe pads required for estimating the plurality of test patterns may be significantly reduced, wherein, in some illustrative embodiments, several test patterns may be simultaneously assessed on the basis of two probe pads. Consequently, process parameters and/or design parameters for manufacturing metallization structures of semiconductor devices may be efficiently monitored and controlled.

17 Claims, 4 Drawing Sheets

U.S. PATENT DOCUMENTS

| | | |
|---|---|---|
| 2003/0020507 A1 | 1/2003 | Song et al. .................. 324/763 |
| 2003/0096436 A1* | 5/2003 | Satya et al. .................. 438/11 |
| 2003/0145292 A1 | 7/2003 | Stine et al. .................... 716/4 |
| 2004/0036495 A1* | 2/2004 | Fazekas et al. .............. 324/765 |
| 2004/0170905 A1 | 9/2004 | Liebmann et al. ............. 430/5 |
| 2004/0205688 A1 | 10/2004 | Pierrat ........................ 716/21 |
| 2005/0091631 A1 | 4/2005 | Gallatin et al. ............... 716/20 |
| 2006/0057475 A1 | 3/2006 | Liebmann et al. ............. 430/5 |
| 2006/0073686 A1 | 4/2006 | Zach et al. ................. 438/551 |
| 2006/0110667 A1 | 5/2006 | Hasegawa et al. ............. 430/30 |
| 2006/0129968 A1 | 6/2006 | Pierrat ........................ 716/21 |
| 2006/0138411 A1 | 6/2006 | Lachenmann et al. ......... 257/48 |
| 2006/0228041 A1 | 10/2006 | Joshi .......................... 382/260 |
| 2006/0273242 A1 | 12/2006 | Hunsche et al. .......... 250/208.1 |
| 2006/0277506 A1 | 12/2006 | Stine et al. .................... 716/4 |
| 2007/0006116 A1 | 1/2007 | Percin et al. .................. 716/21 |
| 2007/0118242 A1 | 5/2007 | Stine et al. .................. 700/109 |
| 2007/0132445 A1 | 6/2007 | Liegl ....................... 324/158.1 |
| 2008/0022254 A1 | 1/2008 | Luo et al. ..................... 716/19 |
| 2008/0072207 A1 | 3/2008 | Verma et al. .................. 716/21 |
| 2008/0081385 A1 | 4/2008 | Marella et al. ................. 438/14 |
| 2008/0261375 A1 | 10/2008 | Lucas et al. ................. 438/400 |
| 2008/0282210 A1 | 11/2008 | Stine et al. ..................... 716/5 |
| 2008/0295061 A1 | 11/2008 | Eisenmann et al. ........... 716/21 |
| 2009/0007030 A1 | 1/2009 | Nehmadi et al. ................ 716/4 |
| 2009/0031261 A1 | 1/2009 | Smith et al. .................... 716/2 |

* cited by examiner

TEST STRUCTURE FOR MONITORING LEAKAGE CURRENTS IN A METALLIZATION LAYER

BACKGROUND OF THE INVENTION

1. Field of the Invention

Generally, the present disclosure relates to the formation of microstructures, such as advanced integrated circuits, and, more particularly, to the fabrication of conductive structures, such as metal regions, and the monitoring of processes associated therewith.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As typically the size of individual circuit elements is reduced with every new circuit generation, thereby improving, for example, the switching speed of the transistor elements, the available floor space for interconnect lines electrically connecting the individual circuit elements is also decreased. Consequently, the dimensions of these inter-connect lines have to be reduced to compensate for a reduced amount of available floor space and for an increased number of circuit elements provided per unit die area. The reduced cross-sectional area of the interconnect lines, possibly in combination with an increase of the static power consumption of extremely scaled transistor elements, may require a plurality of stacked metallization layers to meet the requirements in view of a tolerable current density in the metal lines.

Advanced integrated circuits, including transistor elements having a critical dimension of 0.13 µm and even less may, however, require significantly increased current densities in the individual interconnect lines, despite the provision of a relatively large number of metallization layers, owing to the significant number of circuit elements per unit area. Operating the interconnect lines at elevated current densities, however, may entail a plurality of problems related to stress-induced line degradation, which may finally lead to a premature failure of the integrated circuit. One prominent phenomenon in this respect is the current-induced material transportation in metal lines, also referred to as "electromigration," which may lead to the formation of voids within and hillocks next to the metal line, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.18 µm or less may require significantly reduced cross-sectional areas of the metal lines and, thus, increased current densities, which may render aluminum less attractive for the formation of metallization layers.

Consequently, aluminum is increasingly being replaced by copper as copper exhibits a significantly lower resistivity and exhibits significant electromigration effects at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper lines are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitance of neighboring copper lines. Hence, a thin conductive barrier layer that also imparts the required mechanical stability to the copper is formed to separate the bulk copper from the surrounding dielectric material and only a thin silicon nitride or silicon carbide or silicon carbon nitride layer in the form of a capping layer is frequently used in copper-based metallization layers. Currently, tantalum, titanium, tungsten and their compounds, with nitrogen and silicon, tungsten/cobalt/phosphorous compounds, tungsten/cobalt/boron compounds and the like, are preferred candidates for a conductive barrier layer, wherein the barrier layer may comprise two or more sub-layers of different composition so as to meet the requirements in terms of suppressing diffusion and enhancing adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed which is then patterned to include trenches and vias which are subsequently filled with copper or copper alloy, wherein, as previously noted, prior to or after filling in the metal, a conductive barrier layer is formed. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.1 µm or even less in combination with trenches having a width ranging from 0.1 µm to several µm. Although electrochemical deposition processes for copper are well established in the field of electronic circuit board fabrication, a substantially void-free filling of high aspect ratio vias is an extremely complex and challenging task, wherein the characteristics of the finally obtained copper metal regions significantly depend on process parameters, materials and geometry of the structure of interest. Since the dimensions of interconnect structures are determined by the design requirements and may, therefore, not be significantly altered for a given microstructure, it is of great importance to estimate and control the impact of materials, such as conductive and nonconductive barrier layers, of the copper microstructure and their mutual interaction on the characteristics of the interconnect structure so as to insure both high yield and the required product reliability. In particular, it is important to identify and monitor degradation and failure mechanisms in interconnect structures for various configurations so as to maintain device reliability for every new device generation or technology node.

Accordingly, a great deal of effort has been invested in investigating the characteristics of copper-based metal regions and of the manufacturing techniques associated therewith, in view of electromigration, leakage current behavior and the like, in order to find new materials and process strategies for forming copper-based metallization layers of increased reliability and packing density. Consequently, test structures are usually provided in appropriate locations of the substrate, such as the scribe lanes of the substrate, in order to monitor specific process and material characteristics and/or to determine critical parameters and materials for forming metallization features. One criterion of metallization features, such as vias and metal lines, represents the degree of current leakage between neighboring metal regions, since the leakage current may indicate an insufficient degree of insulation, which may result in reduced device reliability or even complete failure of the device, when occurring in actual device areas of the substrate. For example, via chains may be provided as control monitor structures and may be connected to respective probe pads that allow access to the test structure during an electrical test. For example, a via chain may be connected with two probe pads in order to detect whether or not a current flow is occurring between the two probe pads during an electrical test, wherein the respective via chain may represent a specific characteristic of a process flow and geometric configuration that may be monitored by the dedicated via chain. For other characteristics, that is, other values of process flow parameters, respective via chains are provided. However, with increasing the amount of information that one wants to gain by the leakage test structure, the number of probe pads, which require a moderately high amount of area in the last metallization layer, is required, thereby significantly restricting the utilization of leakage test structures.

Since advanced microstructures, such as fast microprocessors, may require an increased interconnect complexity with dense metal structures at extremely reduced dimensions, there exists a need for enhanced or alternative techniques to examine, monitor and control materials and process technologies involved in the fabrication of complex interconnect structures.

The present disclosure is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique for determining the characteristics of metallization structures of semiconductor devices by assessing respective test patterns in view of leakage current. For this purpose, a plurality of test patterns which may, in some illustrative embodiments, be different with respect to at least one characteristic, such as a different design dimension, a different parameter value during processing, and the like, may be electrically coupled via a plurality of resistors, i.e., circuit elements, which may act as resistors, to respective probe pads, wherein the "network" of resistors connecting the plurality of test patterns with the probe pads may provide information on the leakage status of each of the plurality of test patterns with a significantly reduced number of probe pads. Consequently, by forming a "circuit" including a plurality of resistors and test patterns, a measurement signal may be obtained, which may concurrently include information about the status of each of the plurality of test patterns. Therefore, design parameters, such as critical distances between circuit elements and/or process parameter values may be efficiently determined on the basis of leakage current test measurements, wherein a significantly reduced amount of probe pads may be sufficient compared to conventional leakage current test structures.

According to one illustrative embodiment disclosed herein, a leakage current test structure comprises a substrate, a first circuit element formed above the substrate having a first resistance value and a second circuit element formed above the substrate that has a second resistance value. Furthermore, the test structure comprises a first test assembly and a second test assembly formed above the substrate and a first probe pad and a second probe pad formed above the substrate. Furthermore, an interconnect structure is formed above the substrate and connects the first and second circuit elements with the first and second test assemblies and the first and second probe pads. The first and second circuit elements, the first and second test assemblies and the first and second probe pads may be fabricated on the basis of a microelectronic manufacturing process flow.

According to another illustrative embodiment, a leakage current test structure comprises a substrate and a plurality of test patterns formed above the substrate. Furthermore, the test structure comprises a plurality of resistors formed above the substrate and a first probe pad and a second probe pad formed above the substrate, wherein the plurality of test patterns are electrically coupled to the first and second probe pads via at least some of the plurality of resistors.

According to yet another illustrative embodiment, a method comprises forming a test structure above a substrate, wherein the test structure comprises a plurality of test patterns. The method further comprises obtaining a measurement signal from a first probe pad and a second probe pad formed above the substrate, wherein the measurement signal contains information about a leakage status of each of the plurality of test patterns. Finally, the leakage status for each of the test patterns is determined on the basis of the information.

BRIEF DESCRIPTION OF THE DRAWINGS

The invention may be understood by reference to the following description taken in conjunction with the accompanying drawings, in which like reference numerals identify like elements, and in which:

FIG. 1b schematically illustrates a cross-sectional view of a portion of the test structure of FIG. 1a.

Figure 1A:
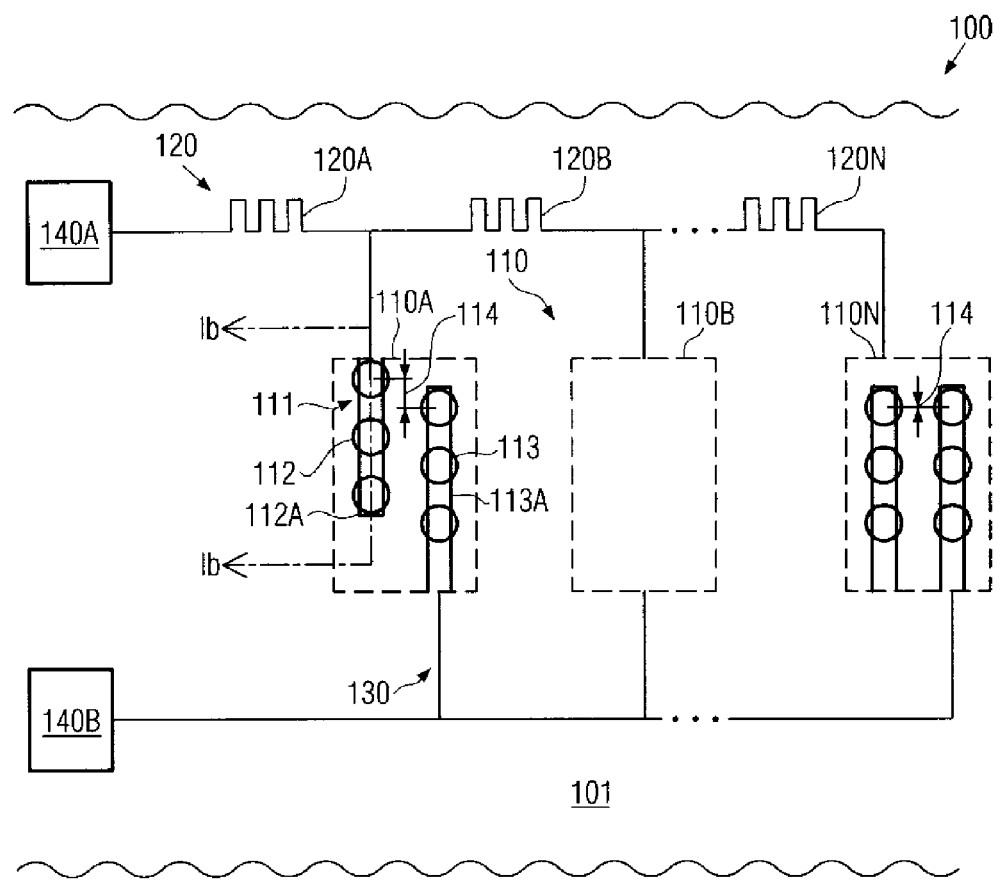
FIG. 1a schematically illustrates a top view of a test structure manufactured on the basis of microelectronic processes and comprising a plurality of test patterns, the leakage status of which may be obtained on the basis of two probe pads.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to the assessment of design criteria and process flow parameters for the fabrication of metallization structures for advanced semiconductor devices. As previously pointed out, the complex configuration of metallization structures of integrated circuits, micromechanical devices and the like for advanced applications requires a thorough monitoring and controlling of design rules, such as critical dimensions, distances between neighboring circuit elements and the like, and of process flow parameters, such as material characteristics, influence of patterning and anneal procedures and the like, during the manufacturing of metallization structures. Consequently, great efforts are typically made in order to provide respective control and monitoring mechanisms, such as respective test structures formed on dedicated test substrates or on product substrates at specific substrate locations.

With respect to the leakage behavior of metallization elements, such as metal lines, vias and the like, a very efficient technique is the determination of the presence of a conductive path between adjacent features within a specified test pattern, which may, for instance, include a plurality of individual components, such as vias, metal lines and the like, wherein, however, conventionally, due to the substantially digital nature of the response of a respective test pattern, i.e., "leakage current is present," that means a substantially low ohmic status, or "leakage current is not present," i.e., a substantially high ohmic status, a plurality of probe pads have been necessary, thereby significantly consuming precious substrate area when the respective test structures are formed on product substrates. Similarly, if dedicated test substrates are used, the high number of probe pads required for conventional leakage current tests may significantly reduce the efficiency of respective substrates with respect to other test procedures to be performed on the basis of the same test substrate.

Contrary to the prior art, the subject matter disclosed herein provides significantly increased efficiency for leakage current tests by providing a test structure having a plurality of test assemblies or test patterns, which may be tested with respect to at least one characteristic in a substantially "simultaneous" manner on the basis of a significantly reduced number of probe pads by connecting the plurality of test patterns or assemblies via a plurality of circuit elements, acting as resistors, to the probe pads. Consequently, the respective test patterns or assemblies may be considered as "switches" so that, by appropriately arranging the resistor network, a high degree of information may be obtained concurrently, even if only two probe pads may be used for obtaining a respective measurement signal. Consequently, a systematic examination of specific parameters, or even of a plurality of different parameters, may be accomplished on the basis of a single test structure having a significantly reduced number of probe pads.

It should be appreciated that the subject matter disclosed herein is highly advantageous in the context of advanced semiconductor devices, such as integrated circuits having a metallization structure on the basis of copper and low-k dielectric materials, since here feature sizes are steadily decreased, thereby also imposing increasingly restrictive process margins on the respective process flows for forming metallization structures. It should be appreciated, however, that the principles disclosed herein may also be applied to leakage tests in any semiconductor devices, irrespective of the specific manufacturing flow and the materials used. Consequently, unless specifically pointed out in the specification and/or the appended claims, the present invention should not be considered as being restricted to a specific manufacturing technique and a specific type of semiconductor device.

FIG. 1a schematically illustrates a top view of a test structure 100 in a simplified manner in order to not unduly obscure the principles of the subject matter disclosed herein. Thus, metal lines or other conductive lines, as well as metal islands, such as probe pads and the like, may be illustrated in the form of a circuit diagram when appropriate. In the embodiment illustrated in FIG. 1a, the test structure 100 may comprise a substrate 101, which may represent any appropriate substrate for forming thereabove a metallization structure of a semiconductor device. For instance, the substrate 101 may represent a bulk semiconductor substrate, such as a silicon substrate or a silicon-on-insulator (SOI) substrate, or any other appropriate carrier having formed thereon a required material layer, such as a semiconductor layer, which may be used for forming circuit elements therein, as will be described later on in more detail. In some illustrative embodiments, the substrate 101 may represent a product substrate having formed thereon a plurality of semiconductor devices, such as integrated circuits, located at dedicated positions, wherein the test structure 100 may be formed on an appropriate position, such as a scribe lane and the like.

The test structure 100 may further comprise a plurality of test assemblies or test patterns 110, such as 110A, 110B, 110N, wherein the number of test patterns may vary from two test patterns to any appropriate number, such as four or more, eight or more and the like. Each of the test patterns 110A, 11B0, 110N may comprise an appropriate assembly of metallization structure components, such as metal lines, metal vias and the like, the characteristics of which may be estimated with respect to leakage currents generated during operation of the test structure 100. In some embodiments, additional components, such as circuit elements, may be included in the test patterns or assemblies 110. Hence, the term test pattern or test assembly is to enclose any composition of features required to define the electric response upon occurrence of a pronounced leakage path in one of the components that may be functionally associated with a respective one of the test patterns 110. Thus, the term "test pattern"

should not be restricted to metallization features within a single metallization layer unless otherwise set forth in the specification or the appended claims. In one illustrative embodiment, at least some of the test patterns 110A, 1010, 110N may comprise a plurality of closely spaced components 111, which may for instance be represented by vias, metal lines and the like. In the embodiment illustrated, the vias 111 may form a first via chain 112 connected by a respective metal line 112A and a second via chain 113 connected by a respective metal line 113A, wherein the individual vias of the chains 112 and 113 may be arranged in a staggered manner. It should be appreciated, however, that the specific arrangement of the components 111 in the respective test patterns 110A, 110B, 110N may be selected in accordance with any specific criterion in order to obtain information with respect to the manufacturing sequence under consideration or respective design dimensions and the like. For example, in the embodiment illustrated in FIG. 1a, the test patterns 110A, 110B, 110N may have substantially the same configuration, wherein a specified characteristic may be varied among the individual test patterns 110A, 110B, 110N. For instance, a distance 114 between staggered vias in the respective via chains 112 and 113 may be used as a design parameter to be examined, starting at the pattern 110A, so that, for instance, the last test pattern 110N may have the smallest distance 114, which may substantially correspond to a parallel arrangement of the respective vias 111. In this case, the probability for encountering a short circuit between the neighboring via chains 112 and 113 may therefore be lowest in the first pattern 110A and may steadily increase so as to reach the highest probability for a leakage current to occur in the last test pattern 110N. In other illustrative embodiments, the respective test patterns 110A, 110B, 110N may be arranged in a substantially arbitrary manner, as will be described later on in more detail.

The test structure 100 may further comprise a plurality of circuit elements 120, wherein, in the illustrative embodiment shown, circuit elements 120A, 120B, 120N may be provided in the form of resistors, wherein the respective resistors 120A, 120B, 120N may have a resistance value that is significantly higher than a corresponding resistance of one of the test patterns 110A, 110B, 110N when a corresponding leakage path may be created therein. For example, an appropriate resistance value for the respective resistors 120A, 120B, 120N may range from several kilo ohms to several hundred kilo ohms. In some illustrative embodiments, the circuit elements 120 may be provided as substantially identical elements, i.e., having substantially the same resistance value, thereby reducing the design complexity, since identical circuit patterns may be used for the respective circuit elements 120. In still other illustrative embodiments, the resistance values of at least some of the resistors 120A, 120B, 120N may differ from each other. The test structure 100 may further comprise an interconnect structure 130, which is, for convenience, indicated in the form of lines in the drawings, wherein it should be appreciated that the interconnect structure 130 may comprise any metal lines, polysilicon lines, vias and contacts as required. Hence, the interconnect structure 130 may be configured so as to connect the plurality of circuit elements 120 and the plurality of test patterns 110A, 110B, 110N according to a specified circuit layout, wherein the interconnect structure 130 also connects the resulting circuitry to a plurality of probe pads 140A, 140B, wherein, in the illustrative example shown, only two probe pads may be provided for the test structure 100. As previously explained, the probe pads 140A, 140B may require a significant substrate area since these pads have to be designed so as to allow access by an external probe for connecting the test structure to an external measurement device.

Figure 1B:
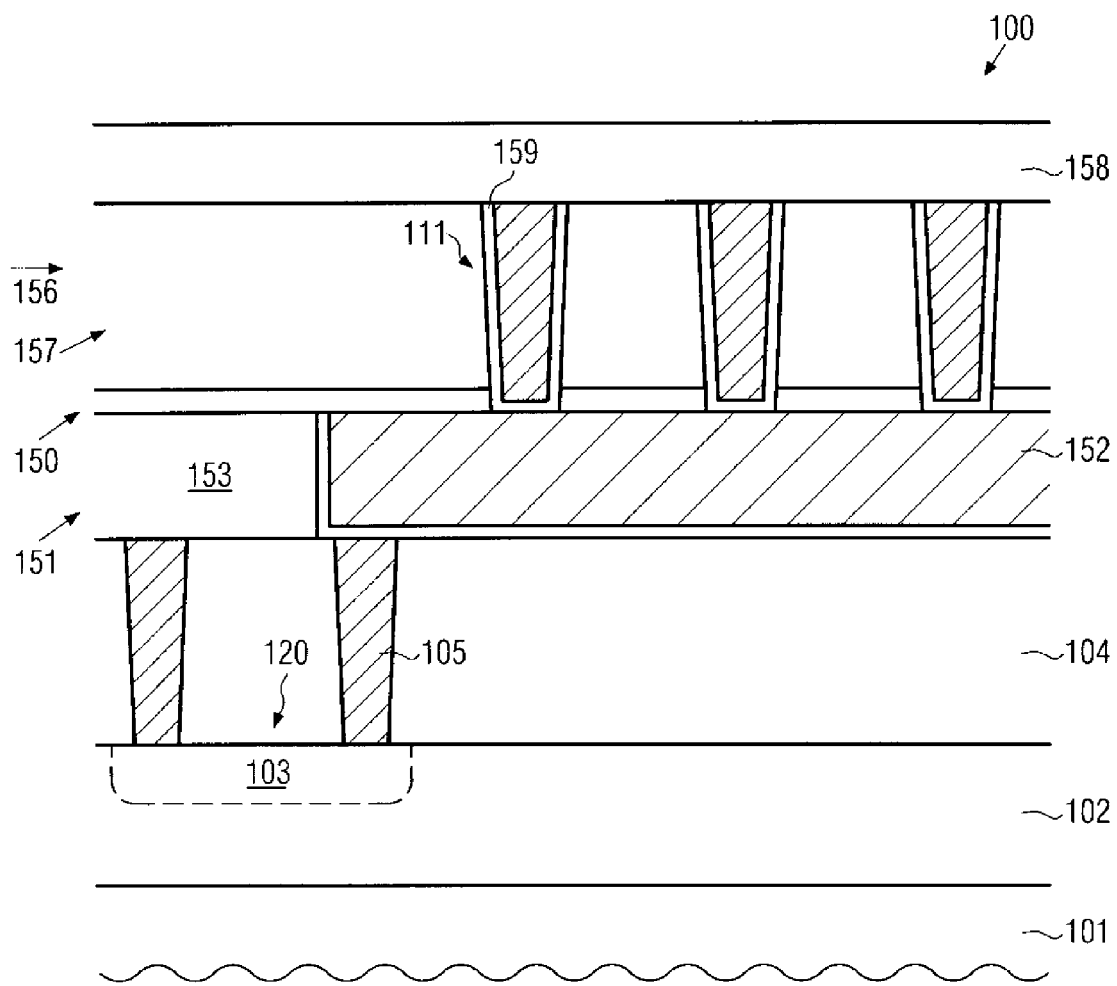

FIG. 1b schematically illustrates a cross-sectional view through a portion of the test structure 100 as shown in FIG. 1a. It should be appreciated that the top view as shown in FIG. 1a is provided as a mixture of an actual top view and a functional diagram in order to more clearly demonstrate the principles of the subject matter disclosed herein. In an actual configuration, the various components may be positioned quite differently and may also be formed in different device levels as will be illustratively described with reference to FIG. 1b. Thus, the test structure 100 may comprise the substrate 101, which may have formed thereon a device layer 102, such as a semiconductor layer, in which may be formed the plurality of circuit elements 120 and in which may be formed other circuit elements, such as transistors, capacitors and the like, when additional test circuitry or actual product devices are also formed above the substrate 101. In this example, it may be assumed that the circuit elements, acting as resistors 120A, 120B, 120N may be provided in the form of respective circuit elements, such as transistors having a moderately high resistance, or, as shown, the circuit elements 120 may be provided in the form of a moderately low doped semiconductor region 103. In other cases, the respective circuit elements 120 may be provided in the form of semiconductor lines of different lengths, different dopant concentration and the like. It should be appreciated that the circuit elements 120 may be formed in accordance with well-established process techniques as typically used for manufacturing semiconductor devices.

Furthermore, an interlayer dielectric material 104 is provided, in which may be formed respective contacts 105, which may be considered as components of the interconnect structure 130. A metallization structure 150, which may comprise a first metallization layer 151, which may comprise a metal line 152, may be embedded into a dielectric material 153. The metallization structure 150 may further comprise a second metallization layer 156, which may include the components, i.e., in the example shown, the via chain 111, which may be embedded in any appropriate dielectric material, thereby forming a via layer 157. The metallization layer 156 may further comprise a metal line layer 158 formed above the layer 157 that may include, for instance, respective components of the interconnect structure 130 and, depending on the configuration of the test structure 100, the probe pads 140A, 140B (not shown). In other illustrative embodiments, further metallization layers may be formed above the layer 158, wherein the respective probe pads 140A, 140B may be provided in an upper metallization layer or in the last metallization layer of the metallization structure under consideration so as to allow access by an external measurement device. For example, if the test structure 100 is provided in a product substrate, the respective current path for measurement signals from the respective test patterns 110A, 110B, 110N to the probe pads 140A, 140B via the circuit elements 120 may extend through the entire metallization structure.

A typical process flow for forming the test structure 100 as shown in FIG. 1b may comprise any appropriate manufacturing techniques, wherein at least the via layer 157 is formed on the basis of a specified manufacturing sequence in order to estimate one or more process parameters or materials or estimate a design parameter, such as the distance 114 (FIG. 1a), the dimensions of the vias 111 and the like. For example, during fabrication of the via layer 157, a respective dielectric material may be deposited and may be subsequently patterned on the basis of advanced lithography and etch techniques, wherein respective process parameters, in combination with the design dimensions, may represent critical parameters for the via layer 157. Furthermore, a barrier layer 159 may have to be deposited, followed by depositing any appropriate metal material such as copper, copper alloys and the like, into the vias and thereafter any excess material may be removed on the basis of process techniques, such as electrochemical etching, chemical mechanical polishing (CMP) and the like. Since each of these processes may itself be a highly complex process, the quality of the respective manufacturing sequence as well as the validity of the respective design dimensions may have to be thoroughly controlled in order to enhance product reliability and to assess the scalability of specific manufacturing techniques.

Again referring to FIG. 1a, as previously explained, in the circuit arrangement as shown, the various test patterns 110A, 110B, 110N may be arranged with an increasing probability for creating a leakage failure during the specified manufacturing sequence. For instance, for a minimum distance 114 defined in the last test pattern 110N, the risk of generating a short circuit between neighboring vias of the different chains 112 and 113 may be extremely high. Consequently, a reliable distance 114 may have to be determined which may additionally provide an efficient process tolerance. For this purpose, the test structure 100 may be operated by, for instance, connecting the probe pads 140A, 140B to an external measurement device, such as a resistance measurement device, in order to estimate the total resistance of the test structure 100. Since each of the test patterns 110A, 110N is connected in series with a respective resistor 120A, 120B, 120N, a leakage current failure, for instance in the last test pattern 110N, having the highest probability for creating a short circuit, may therefore result in a total resistance value in the test pattern 100 that substantially equals the sum of the resistances of the resistors 120 not "shunted" by a respective leakage path. The corresponding value may be obtained by a respective measurement signal obtained via the probe pads 140A, 140B with a value that, in this example, is substantially the sum of all resistors 120A, 120B, 120N, since it may be assumed that the resistance of the "shorted" test pattern 110N is significantly lower compared to the resistance values of the resistors 120A, 120B, 120N. Similarly, if one of the test patterns arranged "before" the test pattern 110N exhibits a failure, for instance the test pattern 110B may have a short circuit, the total resistance value for this state of the test structure 100 obtained via the measurement signal at the probe pads 140A, 140B may substantially yield the resistance value of the resistors 120A, 120B. Since the respective resistance values may be known in advance, the corresponding total value during the test procedure may indicate which of the test patterns 110A, 110B, 110N has failed, wherein it may be assumed that a failure of the test pattern 110B may also result in a failure of the subsequent test patterns due to the increasing probability for generating a leakage failure. Consequently, by providing a series circuit of the resistors 120 in the respective test pattern, wherein a first pair of resistor and test pattern is connected between the probe pads 140A, 140B and subsequent pairs of a resistor and a test pattern are connected to the probe pad 140B and to a node defined by a contact area between a preceding pair of resistor and test pattern, such as a node 160A, the respective test pattern producing a respective leakage failure may be identified. For instance, the pair of resistors 120B connected in series to the test pattern 110B may be connected to the node 160A, and so on, until the last pair 120N, 10N is connected to the respective circuit node of the preceding pair of resistor and test pattern.

Figure 1C:
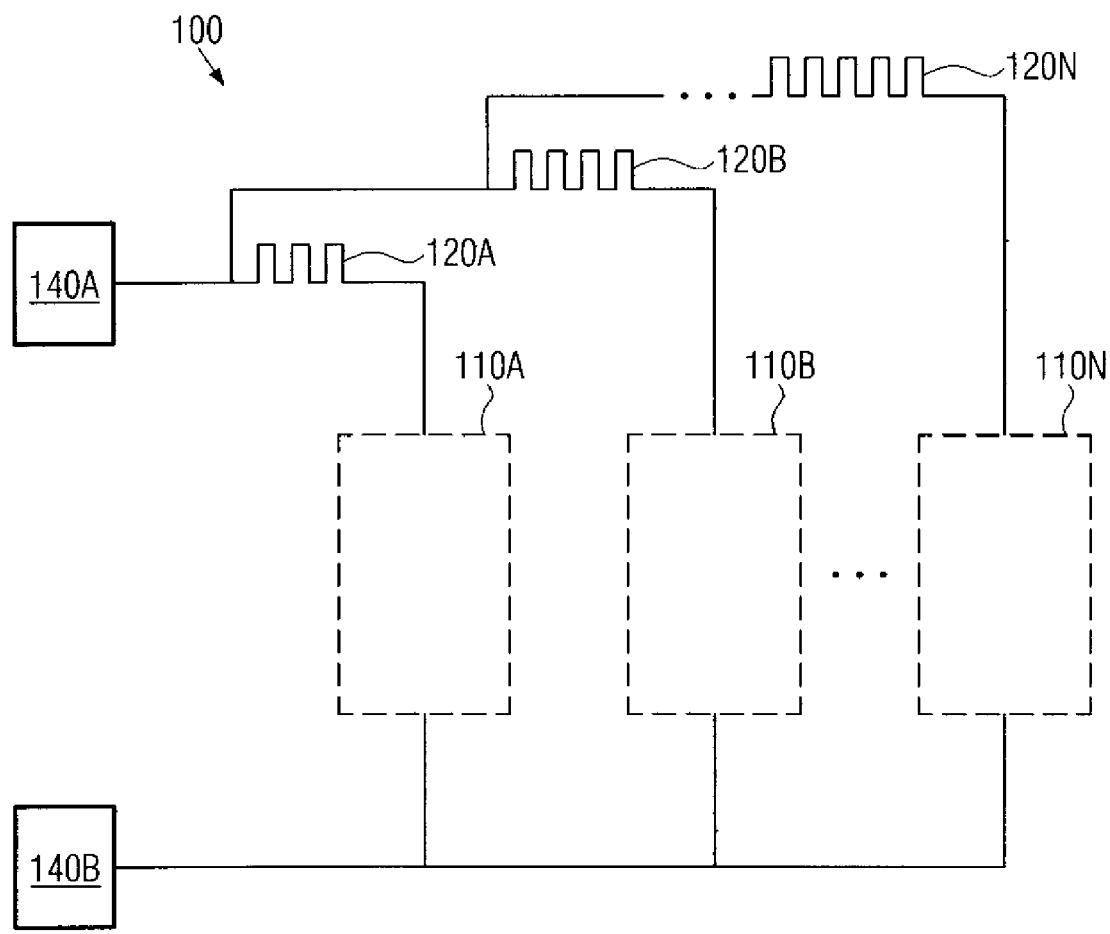
FIGS. 1c and 1d schematically illustrate top views of respective test structures including a resistor network for obtaining an increased amount of information by a single measurement.

FIG. 1c schematically illustrates a further circuit arrangement of the test structure 100 in accordance with further illustrative embodiments, wherein a respective leakage failure in one of the test patterns may be identified substantially without providing the respective test patterns in a predefined sequence of increasing probability for leakage failures. In the embodiment shown, each test pattern 110A, 110B, 110N may be connected in series with a respective one of the resistors 120A, 120B, 120N, which in the present embodiment may have different resistance values which may, however, again be selected sufficiently high compared to a respective leakage failure occurring in one or more of the test patterns 110A, 110B, 110N. Respective different resistance values may be readily obtained on the basis of respective manufacturing techniques, wherein, for instance, a plurality of unit resistor elements in the device level may be appropriately connected so as to obtain the desired different resistance values for the resistors 120A, 120B, 120N. Moreover, the test patterns 110A, 110B, 110N may have formed therein any appropriate arrangement of metallization components wherein not necessarily the same parameter or design dimension may be assessed. For example, the test patterns 110A, 110B, 110N may comprise a plurality of patterns as shown in FIG. 1a and may additionally comprise other test pattern arrangements in which other critical parameters may be estimated. For instance, when a highly complex metallization structure is considered, respective via chains of different metallization levels may be simultaneously assessed. In other examples, different metallization levels may be manufactured on the basis of different process parameters, in order to allow the identification of appropriate parameter values for a specified manufacturing sequence.

During operation of the test structure 100 as shown in FIG. 1c, one or more of the test patterns 110A, 110B, 110N may have a leakage failure, wherein the occurrence of the respective leakage failure may be arbitrary, depending on the specifics of the characteristics to be estimated. For instance, it may be assumed that the first test pattern 110A and the last test pattern 110N may have a leakage failure. Since the respective resistance values of the "shorted" test patterns 10A, 110N are significantly less compared to the respective resistance values of the resistors 120A, 120N, the "result pattern" obtained in this case yields a parallel circuit for the resistors 120A and 120N. Consequently, a respective total resistance value may be determined via the probe pads 140A, 140B, wherein, from the corresponding total resistance value, the result pattern may be recalculated based on the known resistance values of the resistors 120A, 120B, 120N. For example, respective resistance values may be selected for the resistors 120A, 120B, 120N such that, for each possible configuration of leakage paths in the test patterns 110, a unique total resistance value is generated. From the respective total value, the respective result pattern associated with the value may then be readily identified. Consequently, a high degree of flexibility for monitoring leakage failures in the respective test patterns may be obtained, thereby providing the potential for determining a plurality of different characteristics of a manufacturing process sequence and/or design rules for a metallization structure.

Figure 1D:
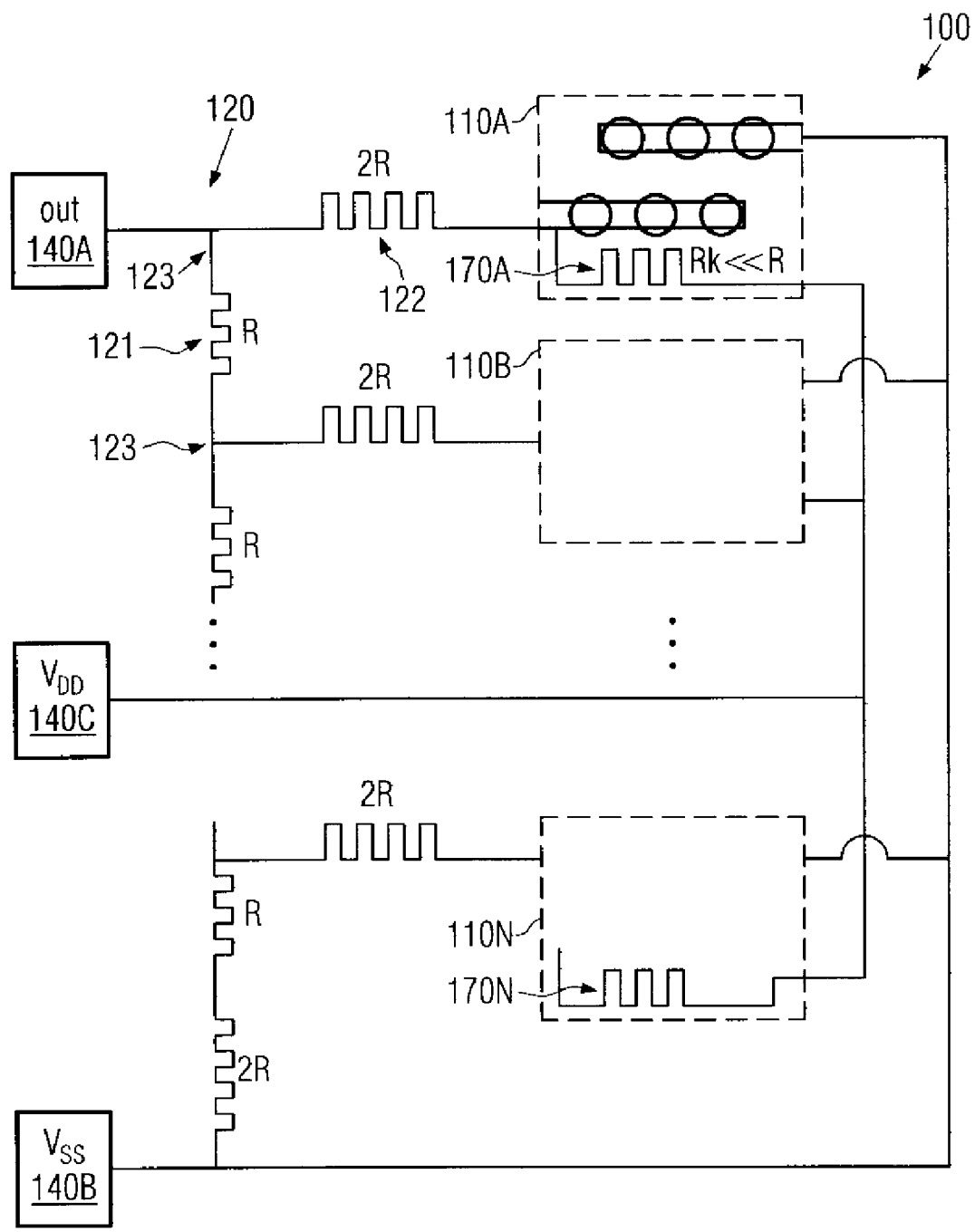

FIG. 1d schematically illustrates the test structure 100 according to other illustrative embodiments of the present invention. The test structure 100 may comprise the plurality of resistors 120, which may be connected so as to form a network that enables the identification of a plurality of different result patterns of the respective test patterns 110A, 110B, 110N irrespective of whether one or more of the test patterns 110A has a leakage current failure. Furthermore, the test patterns 110A, 110B, 110N may have similar or quite different configurations so that the respective probabilities for suffering from a leakage current failure may be uncorrelated between the plurality of test patterns 110A, 110B, 110N, similarly as is described with reference to FIG. 1c. In this arrangement, the plurality of resistors 120 may comprise a plurality of "n" resistors 121 having a resistance value of R, and a plurality of "n+1" resistors 122 having a resistance value of 2R. As illustrated, the "n" resistors 121 and a single resistor 122 form a series of resistors connected between the probe pad 140A, 140B. Furthermore, each of the test patterns 110A, 110B, 110N is connected in series with one of the resistors 122 and a respective pair of resistors 122 and a test pattern 110 is connected to a respective node between two resistors 121, starting with a node 123. Furthermore, each test pattern 110A, 110B, 110N may be coupled to a respective resistor 170A, 170B, 170N, each of which is with one terminal connected to the actual respective test pattern and which is connected with the other terminal to a further probe pad 140C. The resistance values of the respective resistors 170A, 170B, 170N $R_k$ may be lower than the value R but may still be significantly higher than a corresponding resistance value of one of the respective test patterns 110A, 110B, 110N when having a leakage current failure.

During operation of the test structure 100 as shown in FIG. 1d, the probe pad 140C may be supplied with a reference voltage, such as 5 volts DC, or any other appropriate value, indicated as VDD, while the probe pad 140B may serve as the ground potential, which may also be the reference for the voltage VDD and an output voltage obtained at the probe pad 140A. In this circuit arrangement the respective test patterns 110A, 110B, 110N may be considered as switches, which may apply the voltage VDD to the associated resistor 122 when a current leakage failure has not occurred, or which may apply the ground potential, when shunting the respective resistor 170A, to the respective resistor 122. In this way, the voltage detected at the probe pad 140A is determined by the digital value obtained by the respective status of the test patterns 110A, 110B, 110N. That is, when no leakage current failure has occurred, the respective digital value or pattern would be "0, 0, . . . , 0" for the test patterns 110A, 110B, 110n. If, for instance, a respective failure occurred in the last test pattern 110N, the respective digital value would be "0, 0, . . . , 1" producing a respective low voltage at the output pad 140A. Similarly, for any other digital pattern, a unique voltage may be obtained at the output pad 140A. Consequently, the network of resistors 120 may be considered as a "digital to analogue" converter with respect to the status of the respective test patterns 110A, 110B, 110N, which may represent the digital input value that generates the quasi analog output voltage at the probe pad 140A. Hence, a high degree of flexibility may be obtained since a moderately large number of test patterns may be simultaneously assessed on the basis of three probe pads. Moreover, since only three different resistance values, i.e., R, 2R and $R_k$, may be used, the respective circuit configuration for providing the respective resistors is moderately low.

Based on the measurement results obtained by the test structure 100, an appropriate design parameter value and/or a process flow parameter value for one or more parameters may be identified for a specific metallization structure under consideration. A respective parameter value or values may then be used for performing a process sequence in order to obtain respective metallization structures on a plurality of product substrates.

As a result, the present invention provides a test structure and a measurement technique which enables the assessment of a plurality of test patterns by using a resistor network, thereby reducing the required number of probe pads, wherein, in some illustrative embodiments, only two probe pads may be used for estimating the leakage current status of a plurality of test patterns. In some illustrative embodiments, a high degree of flexibility for testing process and design parameters may be achieved since the simultaneous occurrence of respective failures in test patterns may be uniquely determined so that the plurality of parameters may be monitored or controlled with a reduced number of probe pads. Due to the increased flexibility and the significant reduction in substrate area required for respective probe pads, the control efficiency may be significantly enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A leakage current test structure, comprising: a substrate; a first circuit element formed above said substrate and having a first resistance value; a second circuit element formed above said substrate and having a second resistance value; a first test assembly and a second test assembly formed above said substrate; a first probe pad and a second probe pad formed above said substrate; and an interconnect structure formed above said substrate and concurrently connecting said first and second circuit elements with said first and second test assemblies and said first and second probe pads, wherein an equivalent resistance of the leakage current test structure between said first and second probe pads is modulated by fault states of said first and second test assemblies and said first and second resistance values, wherein each of the first and second test assemblies presents an open circuit responsive to being in a non-fault state and a resistive path responsive to being in a fault state.

2. The leakage current test structure of claim 1, wherein said first and second circuit elements are formed in a device layer and said first and second test assemblies are formed in a metallization layer located above said device layer.

3. The leakage current test structure of claim 1, wherein said first test assembly differs from said second test assembly with respect to a specified design criterion.

4. The leakage current test structure of claim 3, wherein said specified design criterion represents a design dimension of at least one component in said first and second test assemblies.

5. The leakage current test structure of claim 4, wherein said design dimension is one of a dimension of a metal region and a distance between two neighboring metal regions.

6. The leakage current test structure of claim 1, wherein said first circuit element and said first test assembly are connected in series between said first probe pad and said second probe pad.

7. The leakage current test structure of claim 6, wherein said second circuit element and said second test assembly are connected in series between a first node and said second probe pad, said first node being defined between said first circuit element and said first test assembly.

8. The leakage current test structure of claim 6, wherein said second circuit element and said second test assembly are connected in series between said first probe pad and said second probe pad and in parallel with said first circuit element and said first test assembly.

9. The leakage current test structure of claim 1, wherein said first and second resistance values are different.

10. The leakage current test structure of claim 1, wherein each of said first and second test assemblies comprises a first test element and a second test element, the fault state corresponding to a resistive path being present between the first and second test elements, wherein the first test elements of the first and second test assemblies are each connected with a third probe pad connected via a circuit element having a third resistance value.

11. A leakage current test structure, comprising: a substrate; a plurality of test patterns formed above said substrate; a plurality of resistors formed in or above said substrate; and a first probe pad and a second probe pad formed above said substrate, said plurality of test patterns being concurrently connected to said first and second probe pads via at least some of said plurality of resistors, wherein an equivalent resistance of the leakage current test structure between said first and second probe pads is modulated by fault states of said plurality of test patterns and resistance values of the at least some of said plurality of resistors, wherein each of the test patterns presents an open circuit responsive to being in a non-fault state and a resistive path responsive to being in a fault state.

12. The leakage current test structure of claim 11, wherein said plurality of resistors are connected in series and said test patterns are coupled to nodes defined between adjacent ones of the resistors.

13. The leakage current test structure of claim 11, wherein said plurality of resistors are connected parallel to each other and are electrically coupled with one terminal to said first probe pad and with another terminal to a respective one of said test patterns.

14. The leakage current test structure of claim 11, further comprising a third probe pad for supplying a reference voltage to said plurality of resistors.

15. The leakage current test structure of claim 14, wherein each test pattern has a dedicated resistor connected to said third probe pad.

16. The leakage current test structure of claim 15, wherein some of said plurality of resistors form a network for providing an output voltage between said first and second probe pads responsive to the reference voltage that depends on the status of each of the plurality of test patterns, the output voltage defining a unique value for each possible combination of fault states of the test patterns.

17. The leakage current test structure of claim 16, wherein each of the test patterns comprises a first test element and a second test element, the fault state corresponding to a resistive path being present between the first and second test elements, and the network comprises:
    a first subset of the plurality of resisters connected in series between the first and second probe pads, wherein a plurality of nodes defined between the resistors in the first subset and at the first and second probe pads; and
    a second subset of resistors, each test pattern having an associated one of the resistors in the second subset connected to the first test element and to one of the nodes, wherein the dedicated resistor associated with each of the test patterns is connected to the associated one of the resistors and the third probe pad and the second test element of each test assembly is connected to the second probe pad.

* * * * *